United States Patent [19]
Kwak

[11] Patent Number: 6,067,258
[45] Date of Patent: May 23, 2000

[54] OPERATION MODE DETERMINING CIRCUIT FOR SEMICONDUCTOR MEMORY DEVICE

[75] Inventor: Sang-Ki Kwak, Choongcheongbuk-Do, Rep. of Korea

[73] Assignee: LG Semicon Co., Ltd., Choongcheongbuk-Do, Rep. of Korea

[21] Appl. No.: 09/204,544

[22] Filed: Dec. 3, 1998

[30] Foreign Application Priority Data

May 13, 1998 [KR] Rep. of Korea ..................... 98-17227

[51] Int. Cl.[7] ........................................... G11C 7/00
[52] U.S. Cl. ........................................... 365/191; 365/193
[58] Field of Search ..................... 365/191, 193, 365/222, 226

[56] References Cited

U.S. PATENT DOCUMENTS

| | | | |
|---|---|---|---|
| 5,204,837 | 4/1993 | Suwa et al. ........................ | 365/201 |
| 5,206,551 | 4/1993 | Chern ............................... | 307/530 |
| 5,229,969 | 7/1993 | Lee et al. ......................... | 365/222 |
| 5,278,792 | 1/1994 | Inoue et al. ...................... | 365/193 |
| 5,365,482 | 11/1994 | Nakayama ....................... | 365/201 |
| 5,457,659 | 10/1995 | Schaefer ......................... | 365/222 |
| 5,532,968 | 7/1996 | Lee ................................. | 365/222 |
| 5,774,402 | 6/1998 | Lee ................................. | 365/193 |
| 5,818,768 | 10/1998 | Sawada et al. .................. | 365/193 |

*Primary Examiner*—Son Mai
*Attorney, Agent, or Firm*—Morgan, Lewis & Bockius LLP

[57] ABSTRACT

An operation mode determining circuit for a semiconductor device, the circuit including a signal detecting circuit sensing first and second signals based on first and second internal signals generated after turning on the device, and an initial cycle detecting circuit sensing an initial cycle from at least one of the first and second internal signals, wherein the operation mode determining circuit determines an operation mode of the semiconductor device in accordance with the first and second signals.

19 Claims, 2 Drawing Sheets

FIG.4A R1 
FIG.4B C1 
FIG.4C CBR 
FIG.4D ROR "L" 
FIG.4E INT 
FIG.4F Node A 
FIG.4G Node B

OPERATION MODE DETERMINING CIRCUIT FOR SEMICONDUCTOR MEMORY DEVICE

This application claims the benefit of Korean patent application No. 17227-1998 filed May 13, 1998, which is hereby incorporated by reference.

BACKGROUND OF THE INVENTION

1. Field of the Invention

The present invention relates to a semiconductor memory device, and more particularly to an operation mode determining circuit for a semiconductor memory device. Although the present invention is suitable for a wide scope of applications, it is particularly suitable for selecting a desirable mode without resort to changing a metal process or a bonding process in determining an operation mode in the semiconductor memory device.

2. Description of the Related Art

In operating a semiconductor memory device, there are various modes, such as a fast page mode, an extended data output (EDO) mode, a static column mode, and a 4 K/8 K refresh mode. In related devices, a desired mode has been selected among the various modes in accordance with a processing method during a bonding process or a metallization process. As a result, manufacturers have to select the desirable mode using several methods, such as modifying circuits on a mask by changing the metallization process or disconnecting fuses for other modes except for the selected mode.

When more than one operation modes are embraced in a single chip, the metallization process or the bonding process should be changed accordingly. However, once a desirable mode is selected in accordance with the metallization process or the bonding process, it is impossible to realize additional modes in the single chip.

SUMMARY OF THE INVENTION

Accordingly, the present invention is directed to an operation mode determining circuit for a semiconductor memory device that obviates the problems due to limitations and disadvantages of the prior art.

An object of the present invention is to provide an operation mode determining circuit for a semiconductor memory that enables a mode selecting operation without changing any processes during a metallization process or a bonding process.

Another object of the present invention is to provide an operation mode determining circuit for a semiconductor memory that realizes various operation modes by using the same mask and the same bonding process in a single chip.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a signal detecting circuit sensing first and second signals based on first and second internal signals generated after turning on the device, and an initial cycle detecting circuit sensing an initial cycle from at least one of the first and second internal signals, wherein the operation mode determining circuit determines an operation mode of the semiconductor device in accordance with the first and second signals.

In another aspect of the present invention, an operation mode determining circuit for a semiconductor device includes a CAS-before-RAS (CBR) sensing circuit detecting a CBR signal, a RAS-only-refresh (ROR) sensing circuit detecting a ROR signal, an initial cycle detecting circuit detecting an initial cycle from an internal signal, and a latch circuit laching the CBR signal from the CBR sensing circuit and the ROR signal from the ROR sensing circuit in accordance with an output signal from the initial cycle detecting circuit, thereby determining an operation mode.

It is to be understood that both the foregoing general description and the following detailed description are exemplary and explanatory, and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate an embodiment of the invention and together with the description serve to explain the principles of the invention.

In the drawings:

FIGS. 4A through 4G are timing diagrams of each unit according the present invention.

DESCRIPTION OF THE PREFERRED EMBODIMENT

Reference will now be made in detail to the preferred embodiment of the present invention, examples of which are illustrated in the accompanying drawings.

Figure 1:
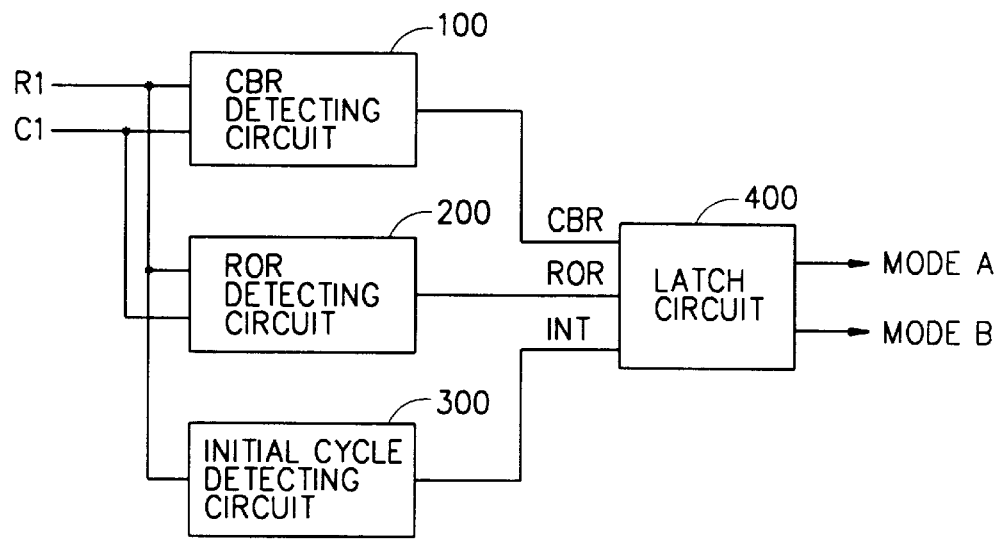
FIG. 1 is a schematic diagram illustrating an operation mode determining circuit for a semiconductor memory device according to the present invention.

FIG. 1 is a schematic diagram which illustrates an operation mode determining circuit for a semiconductor memory device according to the present invention. As shown in FIG. 1, the operation mode determining circuit includes a CAS (Column Address Strobe) before RAS (Row Address Strobe) (CBR) sensing circuit 100, a RAS-Only-Refresh (ROR) sensing circuit 200, an initial cycle sensing circuit 300, and a latch circuit 400. The CBR sensing circuit 100 is provided for sensing a CBR signal from internal signals R1, C1. The ROR sensing circuit 200 detects a ROR signal from the internal signals R1, C1. The initial cycle sensing circuit 300 is for sensing an initial cycle signal from the internal signal R1. The latch circuit 400 latches output signals from the CBR sensing circuit 100 and the ROR sensing circuit 200 in accordance with an output signal INT from the initial cycle sensing circuit 300.

Figure 2:
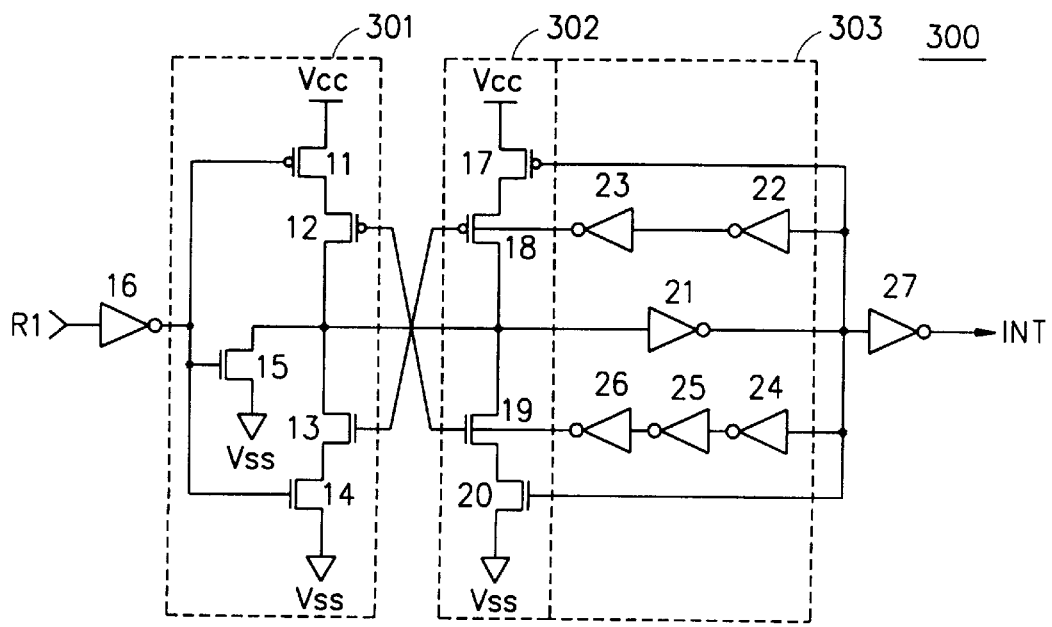
FIG. 2 is a detailed circuit diagram of an initial circuit sensing circuit 300 shown in FIG. 1.

The initial cycle sensing circuit 300 will be more specifically described with reference to FIG. 2 as follows. A first inverter unit 301, a second inverter unit 302, and a control unit 303 are connected between an inverter 16 and an inverter 27. The control unit 303 controls the first and second inverter units 301, 302.

In the first inverter unit 301, a first and a second PMOS transistors 11, 12 and a first and a second NMOS transistors 13, 14 are connected in series between a power supply voltage Vcc and a ground voltage Vss. A third NMOS transistor 15 is connected in parallel between a drain of the first NMOS transistor 13 and the ground voltage Vss. The gates of the first PMOS transistor 11 and the second and third NMOS transistors 14, 15 are connected to an output terminal of the inverter 16.

Third and fourth PMOS transistors 17, 18, and fourth and fifth NMOS transistors 19, 20 in the second inverter unit 302 are connected in series between the power supply voltage Vcc and the ground voltage Vss.

The control unit 303 includes a plurality of inverters 21, 22, 23, 24, 25, and 26. The inverter 21 is provided for inverting and outputting output signals from the first inverter unit 301 and the second inverter unit 302 to the gates of the third PMOS transistor 17 and the fifth NMOS transistor 20, and to the input of the inverter 27. The inverters 22, 23 sequentially invert an output signal from the inverter 21 and output the inverted signal to the gates of the fourth PMOS transistor 18 and the first NMOS transistor 13. The inverters 24, 25, 26 sequentially invert the output signal from the inverter 21 and output the inverted signal to the gates of the fourth NMOS transistor 19 and the second PMOS transistor 12.

Figure 3:
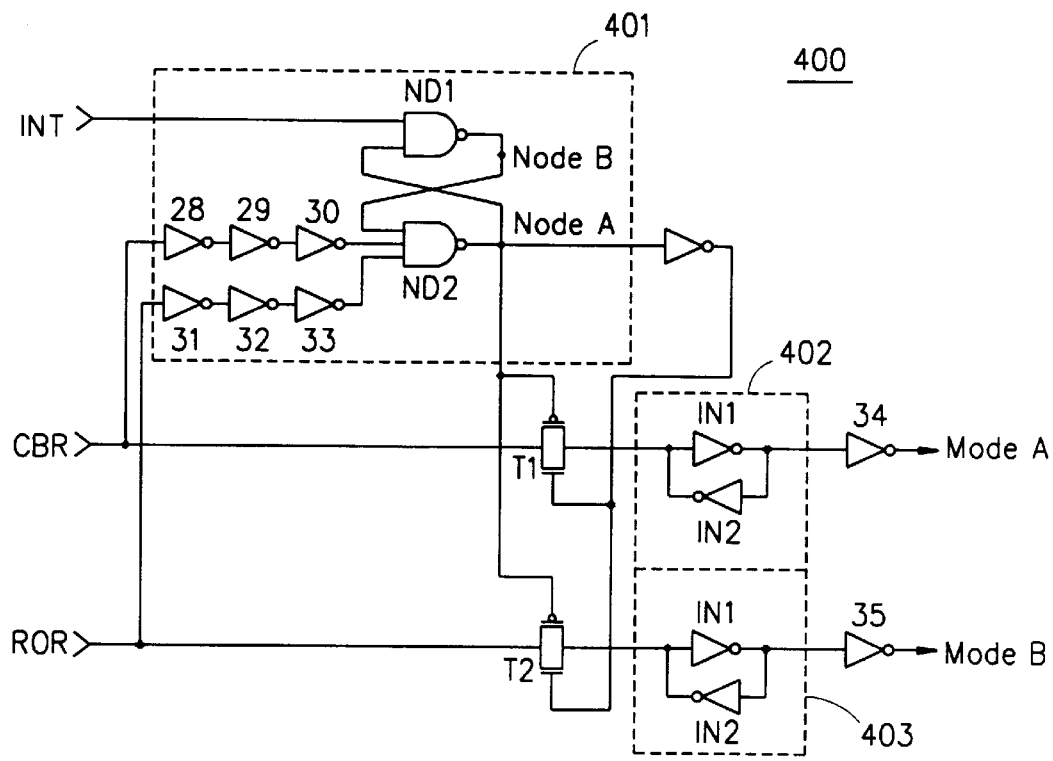
FIG. 3 is a detailed circuit diagram of a latch circuit 400 shown in FIG. 1.
Figure 3:
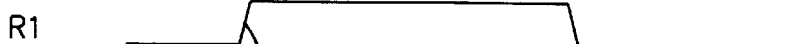
Figure 3:
Figure 3:
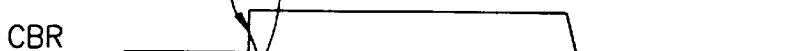
Figure 3:
Figure 3:
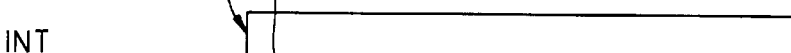
Figure 3:
Figure 3:

The latch circuit 400 of the operation mode determining circuit of the present invention is explained with reference to FIG. 3. The latch circuit 400 includes a control signal generating circuit unit 401, a first latch 402, and a second latch 403. The control signal generating circuit unit 401 logically operates the initial cycle sensing signal INT, and CBR and ROR signals, thereby generating a control signal. Thereafter, the control signal is outputted to transmission gates T1, T2 for transmitting the CBR signal and the ROR signal, respectively, in accordance with the control signal from the control signal generating circuit unit 401. The first latch 402 and the second latch 403 latch output signals from the transmission gates T1, T2, respectively.

The control signal generating unit 401 includes a NAND gate ND1 having a terminal for receiving the initial cycle sensing signal INT, an odd number of inverters 28 to 30 for sequentially delaying the CBR signal, an odd number of inverters 31 to 33 for sequentially delaying the ROR signal, and a NAND gate ND2 NANDing output signals from the NAND gate ND1 and the inverters 30 and 33. The NAND gate ND2 also supplies the NANDed signal to the other input of the NAND gate ND1 and to the transmission gates T1, T2 as a control signal.

Each of the first and second latches 402, 403 includes a pair of inverters IN1, IN2. Output signals from the first and second latches 402 and 403 are supplied to inverters 34 and 35, respectively, and are inverted therein.

Operation of the operation mode determining circuit for the semiconductor memory device of the present invention will be explained in detail as follows.

When power is supplied to the semiconductor device, the initial cycle signals, such as RAS and CAS signals, are generated. A plurality of internal signals are generated in accordance with the RAS and CAS signals. In the present invention, the operation for detecting the CBR and ROR signals from the particular internal signals R1, C1 will be described as an example. In other words, when power is supplied to the semiconductor device in an initial state, the CBR sensing circuit 100 and the ROR sensing circuit 200 sense the CBR signal and the ROR signal, respectively, from the internal signals R1, C1. Also, the initial cycle sensing circuit 300 senses an initial cycle from the internal signal R1.

When the CBR signal is enabled, the semiconductor device enables the mode A. Conversely, the semiconductor device enables the mode B when the ROR signal is enabled. Thus, the CBR refresh operation or the ROR refresh operation, which is a self-refresh operation, is performed in the present invention. However, the CBR and ROR signals become disabled shortly after being enabled since these signals exist for performing an internal operation of the semiconductor device. Thus, when the CBR and ROR signals are disabled, the operation mode determining circuit of the present invention latches the previous state by the latch circuit 400, thereby continually maintaining the enabled condition of the mode A or the mode B.

Now, the operation of the operation mode determining circuit of the present invention will be described in detail referring to the accompanying drawings.

Initially referring to FIG. 1, the references R1 and C1 are the internal signals of RAS and CAS, respectively. The internal signals R1, C1 are at a low level in an initial stand-by state, as shown in FIGS. 4A and 4B. Thus, the CBR and the ROR signals outputted from the CBR sensing circuit 100 and the ROR sensing circuit 200 also become a low level, as shown in FIGS. 4C and 4D.

Next, as shown in FIG. 4E, the third NMOS transistor 15 of the initial cycle sensing circuit 300 is turned on in accordance with the internal signal R1 at the low level, and the initial cycle sensing signal INT at a low level is outputted through the inverters 21, 27. Here, an output signal from the inverter 21 is sequentially inverted through the inverters 22, 23 of the control unit 303 and the inverters 24, 25, 26. After the inverted signals respectively turn on the PMOS transistor 12 and the NMOS transistor 13, the initial cycle sensing signal INT is maintained at the low level in accordance with the NMOS transistors 13, 14, 15, which are turned on.

The initial cycle sensing signal INT at the low level is inputted to the control signal generating unit 401 of the latch circuit 400. A node B then becomes a high level and a node A becomes a low level. Thus, the transmission gates T1, T2 are turned on, and the CBR and ROR signals at the low level are latched in the first latch 402 and the second latch 403, respectively. The signals are then outputted through the inverters 34, 35, thereby enabling the modes A and B.

Next, when the initial cycle signal is generated and the internal signal C1 becomes a high level, the internal signal R1 also becomes the high level. The CBR sensing circuit 100 outputs the CBR signal at the high level and the ROR sensing circuit 200 outputs the ROR signal at the low level, respectively, as shown in FIGS. 4C and 4D.

The first PMOS transistor 11 of the initial cycle sensing circuit 300 is turned on by the internal signal R1 at the high level. On the other hand, the initial cycle sensing signal INT from the inverter 27 becomes the high level and continually maintains the high level in accordance with the turned-on PMOS transistors 17, 18.

Accordingly, the CBR signal at the high level is outputted to the transmission gate T1, the first latch 402 and the inverter 34. After the ROR signal at the low level is outputted to the inverter 35 through the transmission gate T2 and the second latch 403, the mode A is enabled and the mode B is disabled, so that the CBR refresh operation is performed.

The delayed CBR signal at the high level by the inverters 28, 29, 30 is inputted to the NAND gate ND2 of the control signal generating unit 401. The node A thus becomes the high level, and the transmission gates T1, T2 are turned off. However, the first latch 402 latches the previous state and continually enables the mode A.

Although the internal signal R1 is set back to the low level, the initial cycle sensing signal INT maintains the high level, as shown in FIG. 4E. However, when the internal signal R1 is set back to the low level, a current path may be formed in the PMOS transistors 17, 18 and the NMOS transistor 15. Therefore, in order to interrupt the current path, the NMOS transistor 15 may be made smaller in size or made to turn on only when power is applied.

Since the node A continually maintains the high level, the mode A is also continually enabled even when the internal signal R1 is set back to the low level. Thus, the CBR refresh operation is performed without any interruptions.

Further, after power is turned on in the initial state, when the CBR signal and the ROR signal from the CBR sensing circuit 100 and the ROR sensing circuit 200, respectively, are detected to be at a low level and a high level, respectively, the mode B is enabled and the self-refresh operation is thus performed.

The modes A and B, which are examples applied to the present invention, can be substituted for other modes determining an operation of a DRAM. Especially, they may be high-speed operation modes, such as a fast page mode, a static column mode, a nibble mode, and an extended data output (EDO) mode.

As described above, the operation mode determining circuit performs the mode selecting operation and achieves various operation modes in a single chip. In accordance with selected internal signals by determining the operation mode of the semiconductor device using a plurality of internal signals which are generated after power is applied, the mode selecting operation is performed. Further, since the present invention realizes various operation modes with the same mask and bonding process in a single chip.

It will be apparent to those skilled in the art that various modifications and variations can be made in the operation mode determining circuit for the semiconductor memory device of the present invention without departing from the spirit or scope of the invention. Thus, it is intended that the present invention cover the modifications and variations of this invention provided they come within the scope of the appended claims and their equivalents.

What is claimed is:

1. An operation mode determining circuit for a semiconductor device, the circuit comprising:
   a signal detecting circuit sensing first and second signals based on first and second internal signals generated after turning on the device, wherein one of the first and second signals is a RAS-only-refresh (ROR) signal; and
   an initial cycle detecting circuit sensing an initial cycle from at least one of the first and second internal signals, wherein the operation mode determining circuit determines an operation mode of the semiconductor device in accordance with the first and second signals.

2. The operation mode determining circuit of claim 1, further comprising a latch circuit latching output signals from the signal detecting circuit in accordance with an output signal from the initial cycle detecting circuit.

3. The operation mode determining circuit of claim 1, wherein the signal detecting circuit includes a CAS-before-RAS (CBR) sensing circuit and a RAS-only-refresh (ROR) sensing circuit.

4. The operation mode determining circuit of claim 1, wherein the first signal is a CAS-before-RAS (CBR) signal and the second signal is the RAS-only-refresh (ROR) signal, respectively.

5. The operation mode determining circuit of claim 1, wherein the initial cycle sensing circuit includes:
   a first inverter unit inverting the first internal signal;
   a second inverter unit inverting an output signal from the first inverter unit; and
   a control unit controlling the first and second inverter units.

6. The operation mode determining circuit of claim 5, wherein the first inverter unit includes:
   a first PMOS transistor connected to a power supply voltage;
   a second PMOS transistor connected to the first PMOS transistor;
   a first NMOS transistor connected to the second PMOS transistor;
   a second NMOS transistor connected to the first PMOS transistor and the ground; and
   a third NMOS transistor connected to the first PMOS transistor, the second NMOS transistor, and the ground, wherein the first PMOS transistor and the second and third NMOS transistors receive the first internal signal.

7. The operation mode determining circuit of claim 6, wherein the third NMOS transistor is turned on only when the power supply voltage is applied.

8. The operation mode determining circuit of claim 5, wherein the second inverter unit includes:
   a third PMOS transistor connected to a power supply voltage;
   a fourth PMOS transistor connected to the third PMOS transistor;
   a fourth NMOS transistor connected to the fourth PMOS transistor; and
   a fifth NMOS transistor connected to the fourth NMOS transistor and the ground.

9. The operation mode determining circuit of claim 5, wherein the control unit includes:
   a first inverter inverting output signals from the first and the second inverter units;
   a first inverting circuit inverting an output signal from the first inverter and outputting the inverted signal to the second inverter unit; and
   a second inverting circuit inverting an output signal from the first inverter and outputting the inverted signal to the second inverter unit.

10. The operation mode determining circuit of claim 9, wherein the first inverting circuit includes an even number of inverters connected in series.

11. The operation mode determining circuit of claim 9, wherein the second inverting circuit includes an odd number of inverters connected in series.

12. The operation mode determining circuit of claim 2, wherein the latch circuit includes:
   a control signal generating unit generating a control signal by performing a logical operation of the first and second signals and an initial cycle sensing signal output from the initial cycle detecting circuit;
   a first transmission gate receiving an output signal from the control signal generating unit and transmitting the first signal;
   a second transmission gate receiving the output signal from the control signal generating unit and transmitting the second signal;
   a first latch latching an output signal from the first transmission gate; and a second latch latching an output signal from the second transmission gate.

13. The operation mode determining circuit of claim 12, wherein the control signal generating unit includes:

a first NAND gate receiving the initial cycle sensing signal from the initial cycle detecting circuit;

a third inverting circuit delaying the first signal from the signal detecting circuit;

a fourth inverting circuit delaying the second signal from the signal detecting circuit; and a second NAND gate NANDing output signals from the first NAND gate and the third and fourth plurality of inverters and outputting the NANDed signal to an input of the first NAND gate and to the first and second transmission gates.

14. The operation mode determining circuit of claim 13, wherein the third inverting unit includes an odd number of inverters connected in series.

15. The operation mode determining circuit of claim 13, wherein the fourth inverting unit includes an odd number of inverters connected in series.

16. The operation mode determining circuit of claim 12, wherein the control signal generating unit turns off the first and second transmission gates when the initial cycle sensing signal is detected.

17. The operation mode determining circuit of claim 12, wherein the first and second transmission gates are turned off after at least one of the first and second signals is enabled and a selected delay time lapses.

18. The operation mode determining circuit of claim 17, wherein the delay time is determined by the number of inverters connected in series to sequentially invert at least one of the first and second signals.

19. An operation mode determining circuit for a semiconductor device, the circuit comprising:

a CAS-before-RAS (CBR) sensing circuit detecting a CBR signal;

a RAS-only-Refresh (ROR) sensing circuit detecting a ROR signal;

an initial cycle detecting circuit detecting an initial cycle from an internal signal; and a latch circuit laching the CBR signal from the CBR sensing circuit and the ROR signal from the ROR sensing circuit in accordance with an output signal from the initial cycle detecting circuit, thereby determining an operation mode.

* * * * *